United States Patent
Nagayama (10) Patent No.: US 10,056,223 B2
(45) Date of Patent: Aug. 21, 2018

(54) PLASMA PROCESSING APPARATUS AND TEMPERATURE CONTROL METHOD

(71) Applicant: Tokyo Electron Limted, Tokyo (JP)

(72) Inventor: Nobuyuki Nagayama, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 167 days.

(21) Appl. No.: 13/932,151

(22) Filed: Jul. 1, 2013

(65) Prior Publication Data

US 2014/0008020 A1 Jan. 9, 2014

Related U.S. Application Data

(60) Provisional application No. 61/669,166, filed on Jul. 9, 2012.

(30) Foreign Application Priority Data

Jul. 2, 2012 (JP) .................................. 2012-148500

(51) Int. Cl.
| | |
|---|---|
| *H01J 37/02* | (2006.01) |
| *H01J 37/20* | (2006.01) |
| C23C 16/458 | (2006.01) |
| H01L 21/683 | (2006.01) |
| H01L 21/687 | (2006.01) |
| H01L 21/67 | (2006.01) |
| H01J 37/32 | (2006.01) |

(52) U.S. Cl.
CPC .............. *H01J 37/02* (2013.01); *H01J 37/20* (2013.01); *C23C 16/4586* (2013.01); *H01J 37/32155* (2013.01); *H01L 21/67* (2013.01); *H01L 21/6833* (2013.01); *H01L 21/68785* (2013.01); *Y10T 137/0324* (2015.04)

(58) Field of Classification Search
None
See application file for complete search history.

(56) References Cited

U.S. PATENT DOCUMENTS

2004/0168440 A1* 9/2004 Tsuzuki .................... F01N 3/22
60/606
2004/0211764 A1* 10/2004 Doering ............ C23C 16/45521
219/390

(Continued)

FOREIGN PATENT DOCUMENTS

JP 2006-286733 A 10/2006

*Primary Examiner* — Gordon R Baldwin
*Assistant Examiner* — Mirza Israr Javed
(74) *Attorney, Agent, or Firm* — Pearne & Gordon LLP (57) ABSTRACT

A plasma processing apparatus includes a lower electrode 12 on which a wafer W is provided. A second coolant path 70b is formed in a spiral shape in a region within the lower electrode 12 corresponding to where the wafer W is placed. Further, a first coolant path 70a is formed in a spiral shape to be located in a lower region within the lower electrode 12 corresponding to where the second coolant path 70b is formed. A pipeline 72 connected to a chiller unit 71 is branched into a first pipeline 72a connected to the first coolant path 70a and a second pipeline 72b connected to the second coolant path 70b. A check valve 90 allowing a coolant to flow in one direction is provided on the first pipeline 72a, and a reversing unit 92 reversing a flow direction of the coolant is provided on the pipeline 72.

6 Claims, 9 Drawing Sheets

(56) References Cited

U.S. PATENT DOCUMENTS

| | | | |
|---|---|---|---|
| 2006/0219360 A1* | 10/2006 | Iwasaki | G05D 23/1902 156/345.27 |
| 2008/0023147 A1* | 1/2008 | Yokogawa | H01J 37/32431 156/345.53 |
| 2008/0023926 A1* | 1/2008 | Kim | B23Q 3/154 279/126 |
| 2010/0122774 A1* | 5/2010 | Makabe et al. | 156/345.52 |
| 2010/0224355 A1* | 9/2010 | Iwasaki | 165/201 |

* cited by examiner

PLASMA PROCESSING APPARATUS AND TEMPERATURE CONTROL METHOD

CROSS-REFERENCE TO RELATED APPLICATION

This application claims the benefit of Japanese Patent Application No. 2012-148500 filed on Jul. 2, 2012, and U.S. Provisional Application Ser. No. 61/669,166 filed on Jul. 9, 2012, the entire disclosures of which are incorporated herein by reference.

TECHNICAL FIELD

The embodiments described herein pertain generally to a plasma processing apparatus and a temperature control method.

BACKGROUND

In a semiconductor manufacturing process, a plasma processing apparatus configured to perform a plasma process for the purpose of thin film deposition, etching, or the like is widely utilized. Examples of such plasma processing apparatus include a plasma CVD (Chemical Vapor Deposition) apparatus configured to perform a thin film deposition process, a plasma etching apparatus configured to perform an etching process, etc.

The plasma processing apparatus includes a processing chamber in which a plasma processing space is formed; a mounting table configured to mount thereon a processing target substrate within the processing chamber; and a gas supply system configured to introduce a processing gas for a plasma reaction into a processing chamber, etc. Further, in order to excite the processing gas within the processing chamber into plasma, the plasma processing apparatus also includes a plasma generating device configured to supply electromagnetic energy such as a microwave or a RF wave; and a bias voltage applying device configured to apply a bias voltage to the mounting table and accelerate ions in the plasma toward the processing target substrate mounted on the mounting table.

In the plasma processing apparatus, however, since the accelerated ions in the plasma collide with the processing target substrate, the temperature of the processing target substrate may be increased. In order to suppress such a temperature increase, it is known that a coolant flows within the mounting table. For example, it is disclosed in Patent Document 1 that coolant paths are formed in a region within the mounting table corresponding to a central portion of the processing target substrate and in a region within the mounting table corresponding to a periphery portion of the processing target substrate, respectively, and a temperature distribution of the mounting table is controlled by controlling a flow rate of the coolant flown into each coolant path.

Patent Document 1: Japanese Patent Laid-open Publication No. 2006-286733

In the prior art, however, it is not considered to perform the temperature control promptly with a simple configuration. That is, in the prior art, since a multiple number of opening/closing valves are provided at coolant paths connecting a chiller unit for cooling the coolant and the coolant paths within the mounting table and the temperature distribution of the mounting table is controlled by controlling ON/OFF operations of the opening/closing valves, the configuration of the apparatus may be complicated. Further, in the prior art, since a heating unit for heating the coolant is provided in addition to the chiller unit and the temperature is controlled while heating a part of the cooled coolant in the heating unit, it would take a relatively longer time to complete the temperature control.

SUMMARY

In one example embodiment, a plasma processing apparatus includes a processing chamber in which a plasma processing space is formed; a mounting table provided within the processing chamber and configured to mount thereon a processing target substrate; a gas supply device configured to introduce a processing gas to be used in plasma reaction into the plasma processing space; a plasma generating device configured to supply electromagnetic energy to excite the processing gas introduced in the plasma processing space into plasma; a multiple number of coolant paths formed within the mounting table; a temperature controller configured to control a temperature of a coolant flown and circulated through the multiple number of coolant paths; a check valve provided at a part of the multiple number of coolant paths; and a reversing unit configured to reverse a flow direction of the coolant that flows and circulates through the multiple number of coolant paths.

In accordance with the example embodiment, it is possible to provide a temperature control method and a plasma processing apparatus capable of performing a temperature control promptly with a simple configuration.

DETAILED DESCRIPTION

Hereinafter, various example embodiments will be described in detail with reference to the accompanying drawings. In the following detailed description, reference is made to the accompanying drawings, which form a part of the description. In the drawings, similar symbols typically identify similar components, unless context dictates otherwise.

Figure 1:
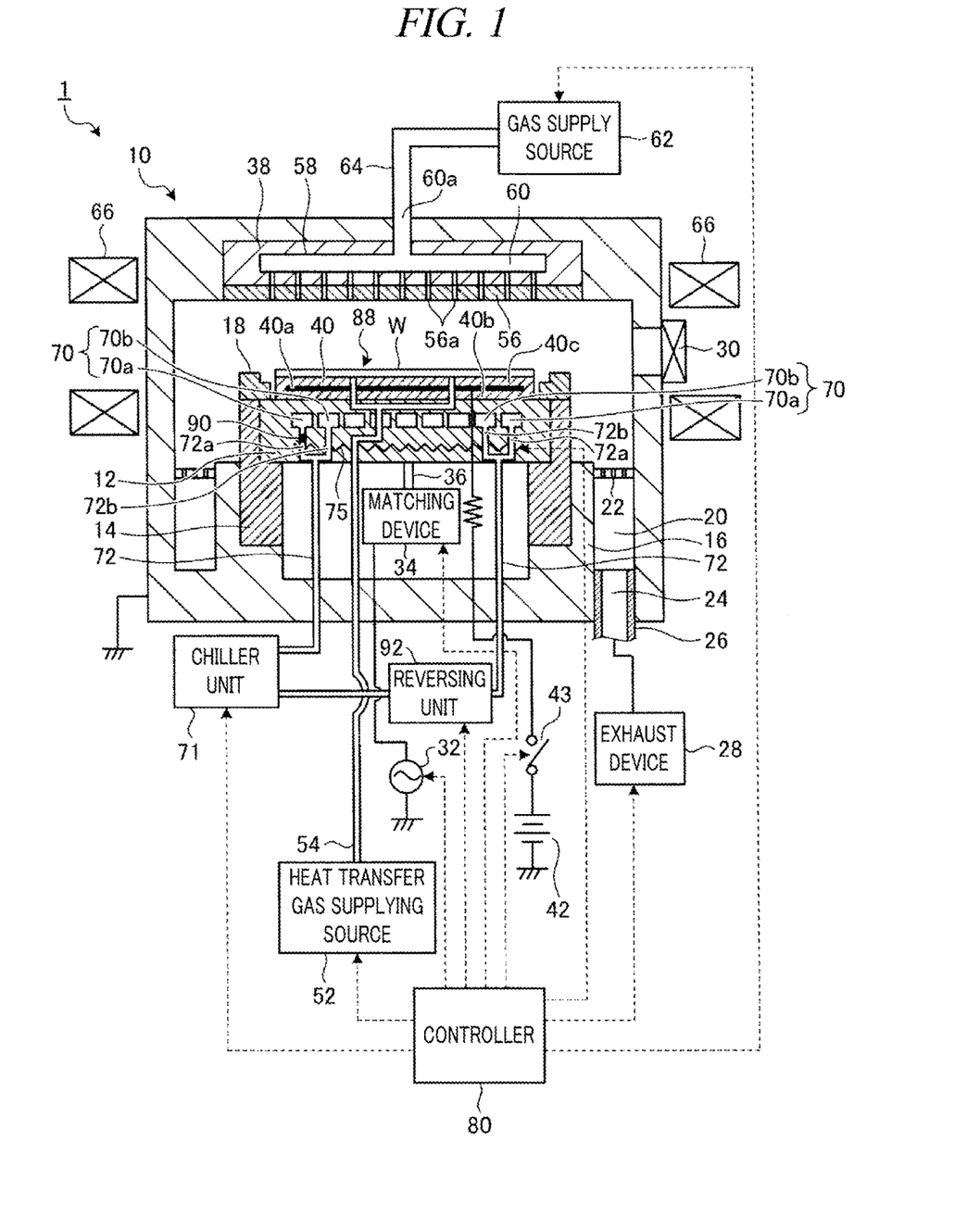
FIG. 1 is a longitudinal cross sectional view illustrating a schematic configuration of a plasma processing apparatus in accordance with an example embodiment.

First, an overall configuration of a plasma processing apparatus will be described. FIG. 1 is a longitudinal cross sectional view illustrating a schematic configuration of a plasma processing apparatus in accordance with an example embodiment.

The plasma processing apparatus 1 is configured as a RIE (Reactive Ion Etching) plasma processing apparatus. The plasma processing apparatus 1 includes a cylindrical chamber (processing chamber 10) made of a metal such as aluminum or stainless steel. The processing chamber 10 is grounded. Within the processing chamber 10, a plasma process such as an etching process is performed on a processing target substrate. In this example embodiment, the plasma processing apparatus serves as a plasma etching apparatus, but not limited thereto.

A mounting table 88 configured to mount thereon a semiconductor wafer W (hereinafter, simply referred to as a "wafer W") as the processing target substrate is provided within the processing chamber 10. The mounting table 88 includes an electrostatic chuck 40 configured to hold the wafer W by an electrostatic attractive force; and a lower electrode 12 configured to support the electrostatic chuck 40. Microprocessing such as etching is performed on the wafer W mounted on the mounting table 88 by plasma.

The lower electrode 12 is made of, e.g., aluminum and is supported on a cylindrical support 16 with an insulating cylindrical holder 14 therebetween. The cylindrical support 16 is vertically extended upward from a bottom of the processing chamber 10. A focus ring 18 made of, e.g., quartz is disposed on a top surface of the cylindrical holder 14 to surround a top surface of the lower electrode 12 in a ring shape.

An exhaust path 20 is formed between a sidewall of the processing chamber 10 and the cylindrical support 16. A ring-shaped baffle plate 22 is provided in the exhaust path 20. An exhaust opening 24 is formed in a bottom portion of the exhaust path 20 and is connected to an exhaust device 28 via an exhaust line 26. The exhaust device 28 includes a non-illustrated vacuum pump and is configured to depressurize a processing space within the processing chamber 10 to a required vacuum level. A gate valve 30 configured to open/close a loading/unloading opening for the wafer W is provided at the sidewall of the processing chamber 10.

A high frequency power supply 32 for generating plasma is electrically connected to the lower electrode 12 via a matching device 34 and a power feed rod 36. The high frequency power supply 32 is configured to apply a high frequency power of, e.g., about 60 MHz to the lower electrode 12. Further, a shower head 38, which will be described later, is provided at a ceiling portion of the processing chamber 10. The shower head 38 serves as an upper electrode of a ground potential. In this configuration, a high frequency voltage from the high frequency power supply 32 is applied between the lower electrode 12 and the shower head 38 capacitively. The high frequency power supply 32 is an example plasma source that supplies power for generating plasma and generates plasma from a gas within the processing chamber 10.

The electrostatic chuck 40 configured to hold the wafer W by an electrostatic attractive force is provided on the top surface of the lower electrode 12. The electrostatic chuck 40 includes an electrode 40a made of a conductive film and a pair of insulating films 40b and 40c embedding the electrode 40a therebetween. A DC power supply 42 is electrically connected to the electrode 40a via a switch 43. The electrostatic chuck 40 attracts and holds the wafer W thereon by a Coulomb force generated by a DC voltage applied from the DC power supply 42.

A heat transfer gas supplying source 52 is configured to supply a heat transfer gas such as a He gas between a top surface of the electrostatic chuck 40 and a rear surface of the wafer W through a gas supply line 54. The shower head 38 disposed at the ceiling portion of the processing chamber 10 includes an electrode plate 56 having a multiple number of gas holes 56a; and an electrode supporting body 58 configured to support the electrode plate 56 thereon detachably. A buffer room 60 is formed within the electrode supporting body 58, and a gas supply line 64 led to a gas supply source 62 is connected to a gas inlet 60a of the buffer room 60. With this configuration, a required gas is supplied into the processing chamber 10 from the gas supply source 62.

A magnet 66 is disposed around the processing chamber 10. The magnet 66 is extended annularly around or concentrically with the processing chamber 10. An RF electric field is formed in a plasma generating space between the shower head 38 and the lower electrode 12 within the processing chamber 10 along a vertical direction by the high frequency power supply 32. Due to a high frequency discharge, high-density plasma may be generated in the vicinity of the lower electrode 12.

A coolant path 70 is formed within the lower electrode 12. The coolant path 70 includes a first coolant path 70a and a second coolant path 70b. A coolant cooled to a preset temperature by a chiller unit 71 is supplied into and circulated through the first coolant path 70a and the second coolant path 70b. To elaborate, a pipeline 72 connected to the chiller unit 71 is branched into a first pipeline 72a and a second pipeline 72b. The first pipeline 72a is connected to the first coolant path 70a, and the second pipeline 72b is connected to the second coolant path 70b. The coolant circulated through the first coolant path 70a is flown out from the first pipeline 72a connected to the first coolant path 70a, and the coolant circulated through the second coolant path 70b is flown out from the second pipeline 72b connected to the second coolant path 70b. The first pipeline 72a and the second pipeline 72b join the single pipeline 72, and the pipeline 72 is connected to the chiller unit 71.

A reversing unit 92 is provided on the pipeline 72. The reversing unit 92 is configured to reverse a flow direction of the coolant cooled by the chiller unit 71. By way of example, but not limitation, the reversing unit 92 is implemented by a four-way valve. Further, the first pipeline 72a is provided with a check valve 90 that allows the coolant to flow in only one direction. The arrangement examples of the first coolant path 70a and the second coolant path 70b and the control mechanism for the flow direction of the coolant by the reversing unit 92 will be described later in detail.

A heater 75 is embedded in the lower electrode 12. A required AC voltage is applied to the heater 75 from a non-illustrated AC power supply. With this configuration, a processing temperature of the wafer W mounted on the electrostatic chuck 40 is controlled to a required temperature level by a cooling operation of the chiller unit 71 and by a heating operation of the heater 75. This temperature control is performed in response to an instruction from a controller 80. Further, it may be possible to divide the heater 75 and arrange them in dual zones corresponding to a central portion and a periphery portion of the electrostatic chuck 40, respectively. In this case, the temperature of the each portion may be controlled individually. With this configuration, it may be possible to perform the temperature control with higher precision.

The controller 80 is configured to control the individual components of the plasma processing apparatus 1, e.g., the exhaust device 28, the high frequency power supply 32, the switch 43 for the electrostatic chuck 40, the matching device 34, the heat transfer gas supplying source 52, the gas supply source 62, the chiller unit 71, the heater within the electrostatic chuck 40 and the reversing unit 92. The controller 80 is connected to a host computer (not shown) or the like.

The controller 80 has a CPU (Central Processing Unit), a ROM (Read Only Memory) and a RAM (Random Access Memory), which are not shown. The CPU executes processes according to various recipes stored in the ROM or the RAM. The recipes store therein apparatus control information depending on a multiple number of plasma process conditions, such as a processing time, temperatures within the processing chamber (an upper electrode temperature, a side wall temperature of the processing chamber, a lower electrode temperature, etc.), a pressure, a high frequency power to be applied, flow rates of various processing gases, and so forth. In the following, a control of the temperature as the recipe will be mainly described. The recipes may be provided by being stored on a storage medium or may be read on the ROM or RAM via a non-illustrated driver. Alternatively, the recipes may be downloaded from a non-illustrated network and stored on the ROM or RAM. Further, in order to implement the function of each component, a DSP (Digital Signal Processor) may be used instead of the CPU. The function of the controller 80 may be implemented by using software or hardware.

In the plasma processing apparatus 1 having the above-described configuration, in order to perform an etching process, the gate valve 30 is first opened, and the wafer W is loaded into the processing chamber 10 while being held on a transfer arm. Then, the wafer W is lifted up above the transfer arm by pusher pins (not shown) protruded from a surface of the electrostatic chuck 40, and the wafer W is held on the pusher pins. Subsequently, after the transfer arm is retreated out of the processing chamber 10, the pusher pins are lowered down into the electrostatic chuck 40, so that the wafer W is mounted on the electrostatic chuck 40.

After the wafer W is loaded, the gate valve 30 is closed. Then, an etching gas is introduced into the processing chamber 10 from the gas supply source 62 at a preset flow rate and a preset flow rate ratio, and an inside of the processing chamber 10 is depressurized to a set pressure by the exhaust device 28. Further, a high frequency power of a certain power level is applied to the lower electrode 12 from the high frequency power supply 32. Further, a DC voltage from the DC power supply 42 is applied to the electrode 40a of the electrostatic chuck 40, so that the wafer W is firmly held on the electrostatic chuck 40. The etching gas introduced from the shower head 38 as in a shower shape is excited into plasma by the high frequency power from the high frequency power supply 32. As a result, the plasma is generated in the plasma generating space between the upper electrode (shower head 38) and the lower electrode 12. A main surface of the wafer W is etched by radicals or ions in the generated plasma.

After the plasma etching is finished, the wafer W is lifted up and held on the pusher pins. After the gate valve 30 is opened and the transfer arm is loaded into the processing chamber 10, the pusher pins are lowered and the wafer W is held on the transfer arm. Subsequently, the transfer arm is retreated out of the processing chamber 10, and a next wafer W is loaded into the processing chamber 10 by the transfer arm. By repeating this process, wafers W are processed consecutively.

Figure 2A:
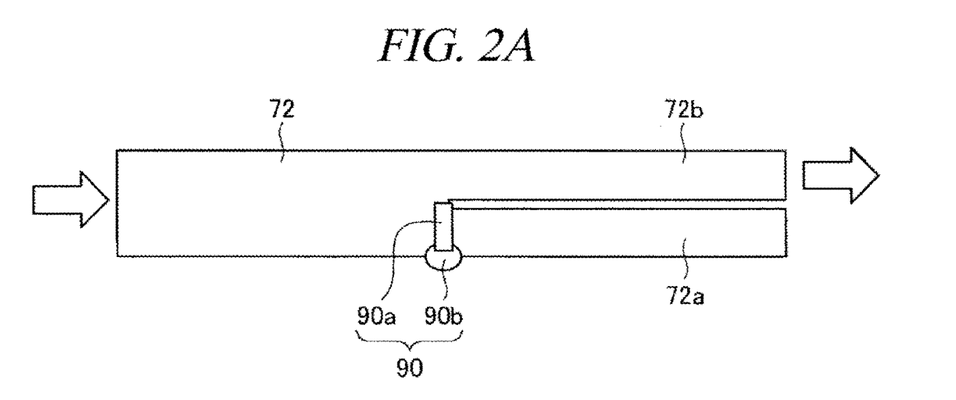
FIG. 2A is a diagram schematically illustrating a check valve.
Figure 2B:
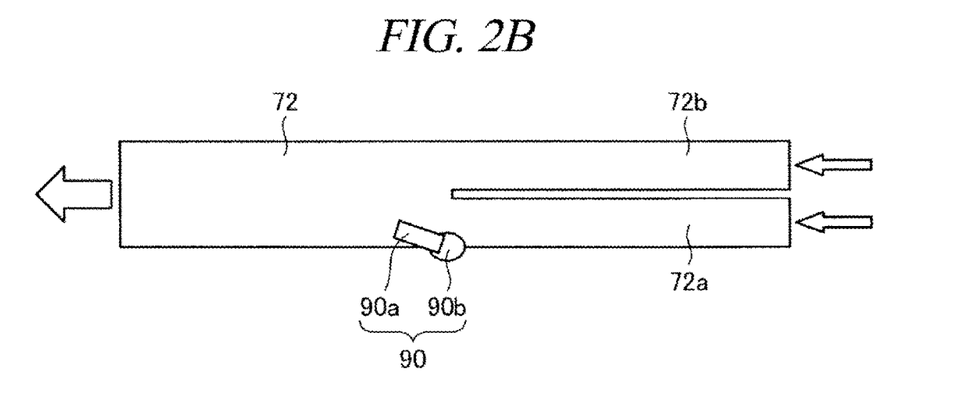
FIG. 2B is a diagram schematically illustrating a check valve.

Now, the configuration of the check valve 90 will be explained. FIG. 2A and FIG. 2B schematically illustrate the check valve. As shown in FIG. 2A and FIG. 2B, the check valve 90 includes a valve sheet 90b at a branch portion of the first pipeline 72a branched from the pipeline 72; and a plate-shaped valve body 90a provided at the valve sheet 90b. By way of example, but not limitation, as shown in FIG. 2A, when a coolant flows from the pipeline 72 toward the first pipeline 72a and the second pipeline 72b, the valve body 90a is rotated about the valve sheet 90b serving as the fulcrum to stand up by the force of the coolant flow, so that a flow path of the first pipeline 72a is closed. As a result, in FIG. 2A, the coolant does not flow into the first pipeline 72a but flows only into the second pipeline 72b.

Meanwhile, when the flow direction of the coolant is reversed and the coolant flows from the first pipeline 72a and the second pipeline 72b toward the pipeline 72, as shown in FIG. 2B, the valve body 90a is rotated about the valve sheet 90b serving as the fulcrum to fall down by the force of the coolant flow, so that the flow path of the first pipeline 72a is opened. As a result, in FIG. 2B, the coolant flows into both the first pipeline 72a and the second pipeline 72b.

Figure 3A:
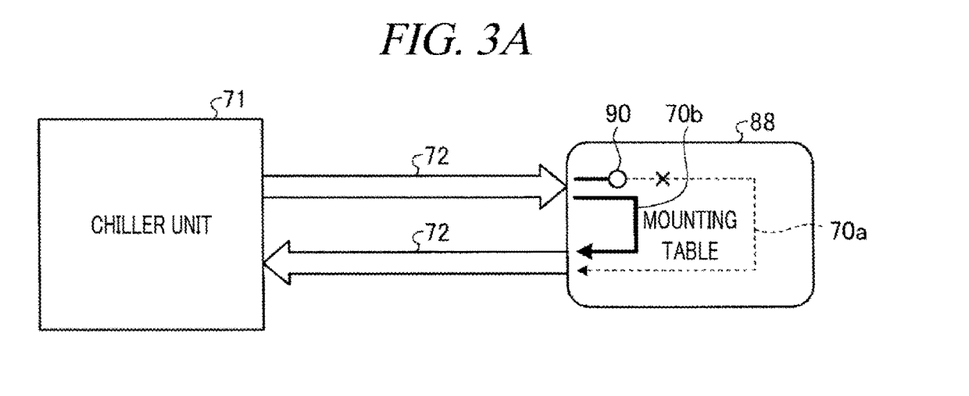
FIG. 3A is a diagram schematically illustrating a temperature control for a mounting table.
Figure 3B:
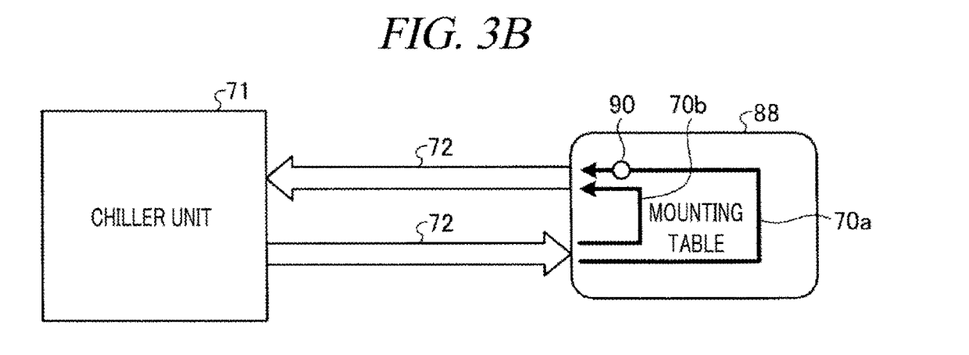
FIG. 3B is a diagram schematically illustrating a temperature control for the mounting table.

Now, a temperature control for the mounting table in accordance with the present example embodiment will be schematically described. FIG. 3A and FIG. 3B are diagrams for schematically illustrating a temperature control for the mounting table. As depicted in FIG. 3A, since the flow of the coolant cooled to a preset temperature in the chiller unit 71 is blocked by the check valve 90 in a certain direction, the coolant cools the mounting table 88 while flowing through only one coolant path of the second coolant path 70b.

Meanwhile, as illustrated in FIG. 3B, if the reversing unit 92 reverses the flow direction of the coolant in response to an instruction from the controller 80, the coolant cooled to a preset temperature in the chiller unit 71 cools the mounting table 88 while flowing through the two coolant paths of the first coolant path 70a and the second coolant path 70b. In this way, by providing the check valve 90 and reversing the flow direction of the coolant, it is possible to allow the coolant to flow through either one or both of the coolant paths within the mounting table 88 selectively. Accordingly, a temperature distribution of the mounting table 88 (and the wafer W) can be controlled. Below, examples of controlling the temperature distribution of the mounting table 88 (and the wafer W) will be explained.

First Example Embodiment

Figure 4A:
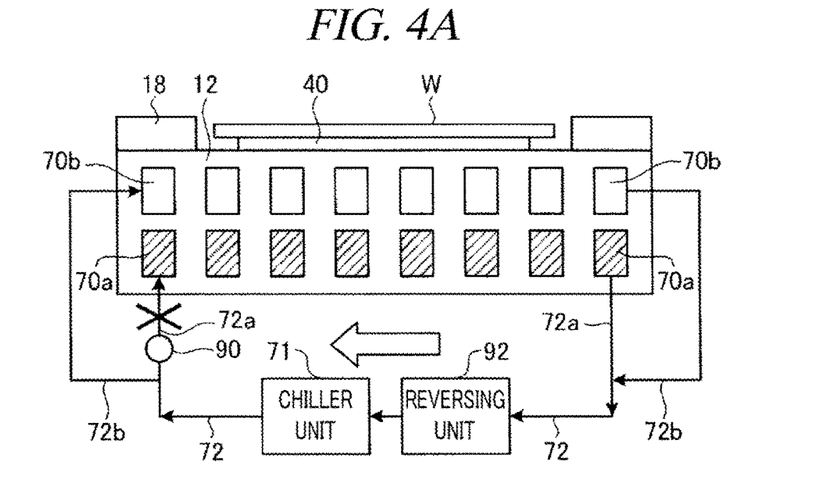
FIG. 4A is a diagram illustrating arrangement of coolant paths in accordance with a first example embodiment.
Figure 4B:
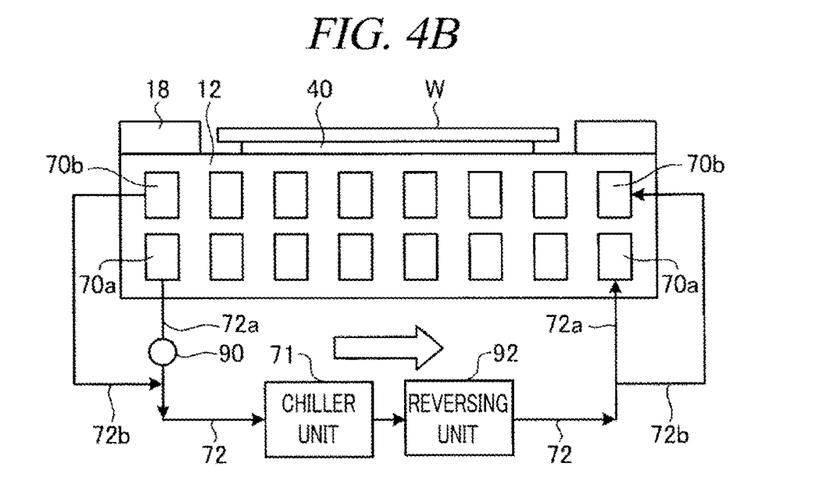
FIG. 4B is a diagram illustrating the arrangement of the coolant paths in accordance with the first example embodiment.
Figure 4C:
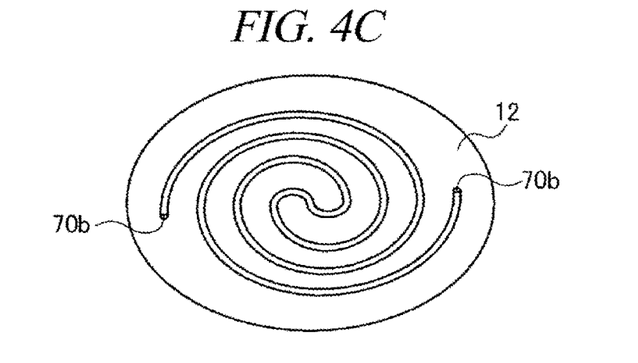
FIG. 4C is a diagram illustrating the arrangement of the coolant paths in accordance with the first example embodiment.

FIG. 4A, FIG. 4B and FIG. 4C are diagrams illustrating a first example embodiment regarding the arrangement of coolant paths. As shown in FIG. 4A and FIG. 4B, the first coolant path 70a and the second coolant path 70b are formed in a region within the lower electrode 12 (mounting table)

corresponding to a region where the wafer W is placed. The first coolant path 70a and the second coolant path 70b are separated from each other in a vertical direction. To elaborate, the second coolant path 70b is formed in a spiral shape in an upper region within the lower electrode 12. The first coolant path 70a is also formed in a spiral shape to be located in a lower region within the lower electrode 12, i.e., below the region where the second coolant path 70b is formed. FIG. 4C is a conceptual diagram of the second coolant path 70b in the spiral shape when viewed from the top.

The coolant cooled in the chiller unit 71 is flown out through the pipeline 72, and then, is flown into the first pipeline 72a and the second pipeline 72b which are branched from the pipeline 72. The first pipeline 72a is connected to one end of the first coolant path 70a, and the second pipeline 72b is connected to one end of the second coolant path 70b. Further, the coolant that has passed through the first coolant path 70a is flown out through the first pipeline 72a connected to the other end of the first coolant path 70a, and the coolant that has passed through the second coolant path 70b is flown out through the second pipeline 72b connected to the other end of the second coolant path 70b. The coolant flown out through the first pipeline 72a and the second pipeline 72b flows into the single pipeline 72 and is returned back into the chiller unit 71 via the reversing unit 92. Then, the coolant is cooled again in the chiller unit 71, and flows into and circulates through the inside of the lower electrode 12 again.

Further, the first pipeline 72a connected to the one end of the first coolant path 70a is equipped with the check valve 90. When the coolant flows in a direction as shown in FIG. 4A, the check valve 90 is closed, so that the coolant does not flow through the first coolant path 70a but only flows through the second coolant path 70b. Meanwhile, as shown in FIG. 4B, when the coolant flows after the flow direction of the coolant is reversed, the check valve 90 is opened, so that the coolant flows through both the first coolant path 70a and the second coolant path 70b.

Figure 5:
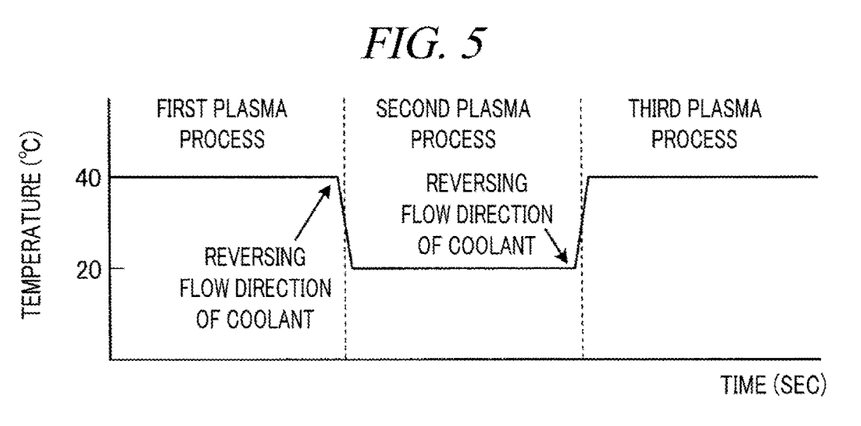
FIG. 5 is a diagram showing an example time chart for the temperature control.

Now, a temperature control method in accordance with the first example embodiment will be discussed. FIG. 5 is an example time chart for temperature control. In FIG. 5, a horizontal axis represents a lapse of time (second) and a vertical axis represents a temperature of the wafer W.

In the temperature control method in accordance with the first example embodiment, the controller 80 may reverse the flow direction of the coolant by controlling the reversing unit 92 according to the switchover timing of plasma processes performed in the plasma processing apparatus 1. By way of example, but not limitation, the plasma processing apparatus 1 is configured to perform a first plasma process, a second plasma process and a third plasma process consecutively, as depicted in FIG. 5.

In the first plasma process and the third plasma process, it is assumed that the required plasma process is performed by maintaining the temperature of the wafer W at a high level of, e.g., about 40° C. Meanwhile, in the second plasma process, it is assumed that the required plasma process is performed by maintaining the temperature of the wafer W at a low level of, e.g., about 20° C.

In this case, the controller 80 is configured to set the flow direction of the coolant such that the check valve 90 is closed (as shown in FIG. 4A) while the first plasma process is being performed. Accordingly, while the first plasma process is being performed, the coolant does not flow through the first coolant path 70a but flows only through the second coolant path 70b. As a result, the wafer W can be maintained at the relatively high temperature of about 40° C., as shown in FIG. 5.

Meanwhile, at the switchover timing from the first plasma process into the second plasma process, the controller 80 is configured to reverse the flow direction of the coolant by controlling the reversing unit 92. As a result, the flow direction of the coolant is reversed and the check valve 90 is opened, as shown in FIG. 4B. Accordingly, while the second plasma process is being performed, the coolant flows through both of the first coolant path 70a and the second coolant path 70b. Consequently, the wafer W is maintained at a relatively low temperature of about 20° C., as depicted in FIG. 5.

Then, at the switchover timing from the second plasma process into the third plasma process, the controller 80 is configured to reverse the flow direction of the coolant again by controlling the reversing unit 92. As a result, the flow direction of the coolant is reversed and the check valve 90 is again closed, as illustrated in FIG. 4A. Accordingly, while the third plasma process is being performed, the coolant does not flow through the first coolant path 70a but flows only through the second coolant path 70b. Consequently, the wafer W is maintained at a relatively high temperature of about 40° C., as depicted in FIG. 5.

As described above, in accordance with the plasma processing apparatus 1 and the temperature control method of the present example embodiment, by setting the simple configuration of revering the flow direction of the coolant by using the check valve 90, the temperature of the wafer W can be promptly controlled to required temperatures suitable for each plasma process when performing the multiple number of plasma processes.

Second Example Embodiment

Figure 6A:
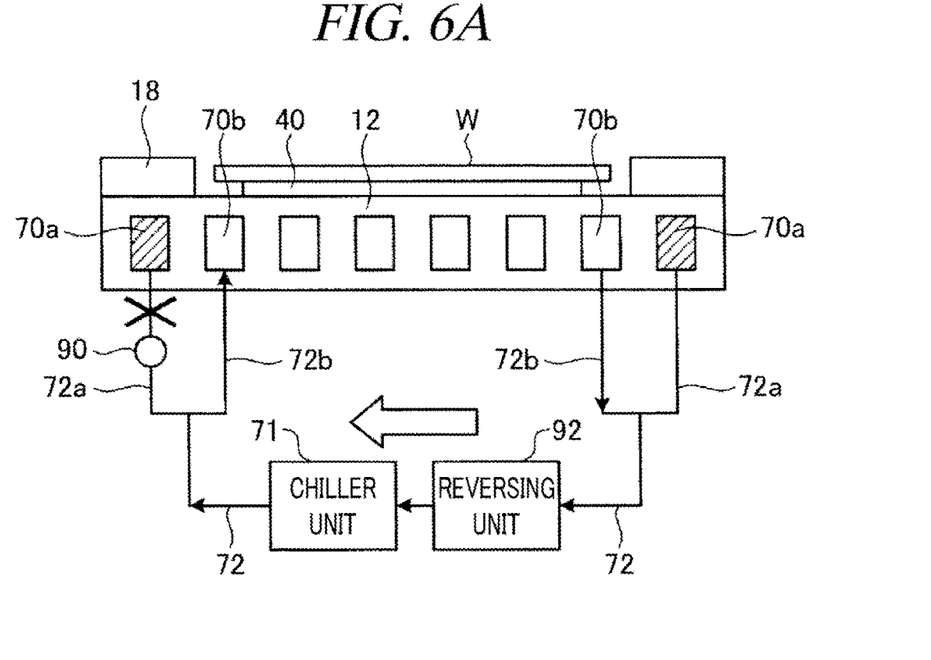
FIG. 6A is a diagram illustrating arrangement of coolant paths in accordance with a second example embodiment.
Figure 6B:
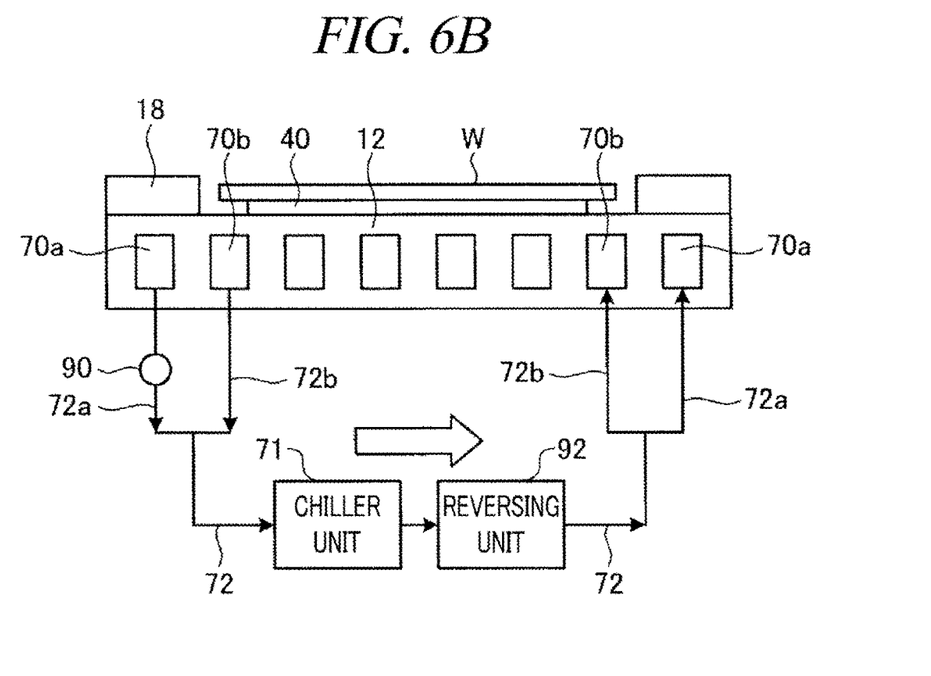
FIG. 6B is a diagram illustrating the arrangement of the coolant paths in accordance with the second example embodiment.

Subsequently, a second example embodiment regarding the arrangement of coolant paths will be described. FIG. 6A and FIG. 6B are diagrams illustrating the second example embodiment regarding the arrangement of coolant paths. As shown in FIG. 6A and FIG. 6B, in accordance with the second example embodiment, a first coolant path 70a is formed in a spiral shape in a region within the lower electrode 12 corresponding to the focus ring 18. Further, a second coolant path 70b is also formed in a spiral shape in a region within the lower electrode 12 corresponding to a region where the wafer W is placed.

The coolant cooled in the chiller unit 71 is flown out through the pipeline 72, and then, is flown into the first pipeline 72a and the second pipeline 72b which are branched from the pipeline 72. The first pipeline 72a is connected to one end of the first coolant path 70a, and the second pipeline 72b is connected to one end of the second coolant path 70b. Further, the coolant that has passed through the first coolant path 70a is flown out through the first pipeline 72a connected to the other end of the first coolant path 70a, and the coolant that has passed through the second coolant path 70b is flown out through the second pipeline 72b connected to the other end of the second coolant path 70b. The coolant flown out through the first pipeline 72a and the second pipeline 72b flows into the single pipeline 72 and is returned back into the chiller unit 71 via the reversing unit 92. Then, the coolant is cooled again in the chiller unit 71 and flows into and circulates through the inside of the lower electrode 12 again.

Further, the first pipeline 72a connected to the one end of the first coolant path 70a is equipped with the check valve 90. When the coolant flows in a direction as shown in FIG. 6A, the check valve 90 is closed, so that the coolant does not flow through the first coolant path 70a but only flows through the second coolant path 70b. Meanwhile, as shown in FIG. 6B, when the coolant flows after the flow direction of the coolant is reversed, the check valve 90 is opened, so that the coolant flows through both the first coolant path 70a and the second coolant path 70b.

In the second example embodiment, it is assumed that the focus ring 18 is heated as a result of performing a plasma process in the state shown in FIG. 6A, for example. In this case, the controller 80 is configured to reverse the flow direction of the coolant by the reversing unit 92 as shown in FIG. 6B, so that the coolant can flow in the region (i.e., the first coolant path 70a) within the lower electrode 12 corresponding to the focus ring 18. Accordingly, it is possible to cool the focus ring 18 by the coolant flowing through the first coolant path 70a. As a result, a temperature distribution of the wafer W can be uniformed.

Third Example Embodiment

Figure 7A:
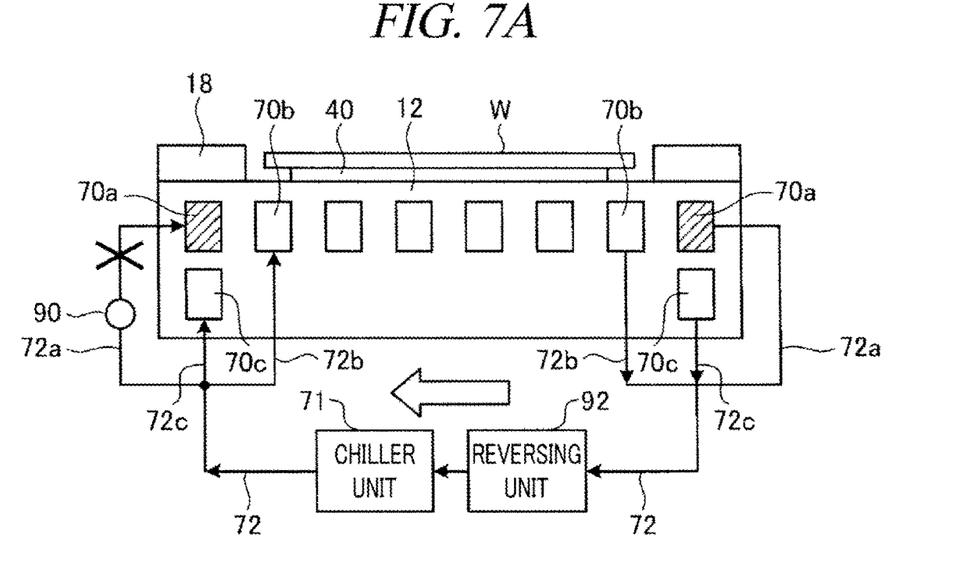
FIG. 7A is a diagram illustrating arrangement of coolant paths in accordance with a third example embodiment.
Figure 7B:
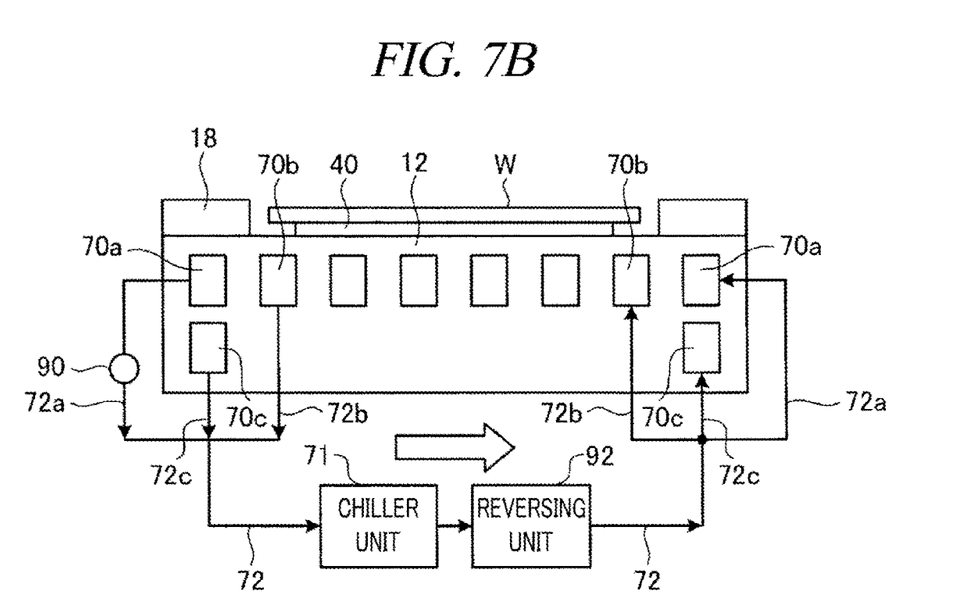
FIG. 7B is a diagram illustrating the arrangement of the coolant paths in accordance with the third example embodiment.

Now, a third example embodiment regarding the arrangement of coolant paths will be described. FIG. 7A and FIG. 7B are diagrams illustrating the third example embodiment regarding the arrangement of coolant paths. As shown in FIG. 7A and FIG. 7B, in accordance with the third example embodiment, a first coolant path 70a is formed in a spiral shape in a region within the lower electrode 12 corresponding to the focus ring 18. Further, a second coolant path 70b is also formed in a spiral shape in a region within the lower electrode 12 corresponding to a region where the wafer W is placed. Further, a third coolant path 70c is formed in a spiral shape within the lower electrode 12 to be located below the region where the first coolant path 70a is formed. In FIG. 7A and FIG. 7B, although each of the first coolant path 70a and the third coolant path 70c are shown to be a coolant path having a single turn for the simplicity of illustration, each coolant path may be formed in a spiral shape (see FIG. 4C) in each region. In the drawings illustrated below, each coolant path may also be formed in a spiral shape in each region.

The coolant cooled in the chiller unit 71 is flown out through the pipeline 72, and then, is flown into the first pipeline 72a, the second pipeline 72b and a third pipeline 72c which are branched from the pipeline 72. The first pipeline 72a is connected to one end of the first coolant path 70a; the second pipeline 72b is connected to one end of the second coolant path 70b; and the third pipeline 72c is connected to one end of the third coolant path 70c. Further, the coolant that has passed through the first coolant path 70a is flown out through the first pipeline 72a connected to the other end of the first coolant path 70a; the coolant that has passed through the second coolant path 70b is flown out through the second pipeline 72b connected to the other end of the second coolant path 70b; and the coolant that has passed through the third coolant path 70c is flown out through the third pipeline 72c connected to the other end of the third coolant path 70c. The coolant flown out through the first pipeline 72a, the second pipeline 72b and the third pipeline 72c flows into the single pipeline 72 and is returned back into the chiller unit 71 via the reversing unit 92. Then, the coolant is cooled again in the chiller unit 71 and flows into and circulates through the inside of the lower electrode 12 again.

Further, the first pipeline 72a connected to the one end of the first coolant path 70a is equipped with the check valve 90. When the coolant flows in a direction as shown in FIG. 7A, the check valve 90 is closed, so that the coolant does not flow through the first coolant path 70a but only flows through the second coolant path 70b and the third coolant path 70c. Meanwhile, as shown in FIG. 7B, when the coolant flows after the flow direction of the coolant is reversed, the check valve 90 is opened, so that the coolant flows through all of the first coolant path 70a, the second coolant path 70b and the third coolant path 70c. In the third example embodiment, although the check valve is provided at the first pipeline 72a, the check valve may also be provided at the third pipeline 72c, by way of example.

In the third example embodiment, it is assumed that the focus ring 18 is heated as a result of performing a plasma process in the state shown in FIG. 7A, for example. In this case, the controller 80 is configured to reverse the flow direction of the coolant by the reversing unit 92 as shown in FIG. 7B, so that the coolant can flow in the region (i.e., the first coolant path 70a) within the lower electrode 12 corresponding to the focus ring 18. Accordingly, it is possible to cool the focus ring 18 by the coolant flowing through the first coolant path 70a. As a result, a temperature distribution of the wafer W can be uniformed. Furthermore, in accordance with the third example embodiment, since the first coolant path 70a and the third coolant path 70c are formed in the regions within the lower electrode 12 corresponding to the focus ring 18, the focus ring 18 can be cooled more rapidly.

Fourth Example Embodiment

Figure 8A:
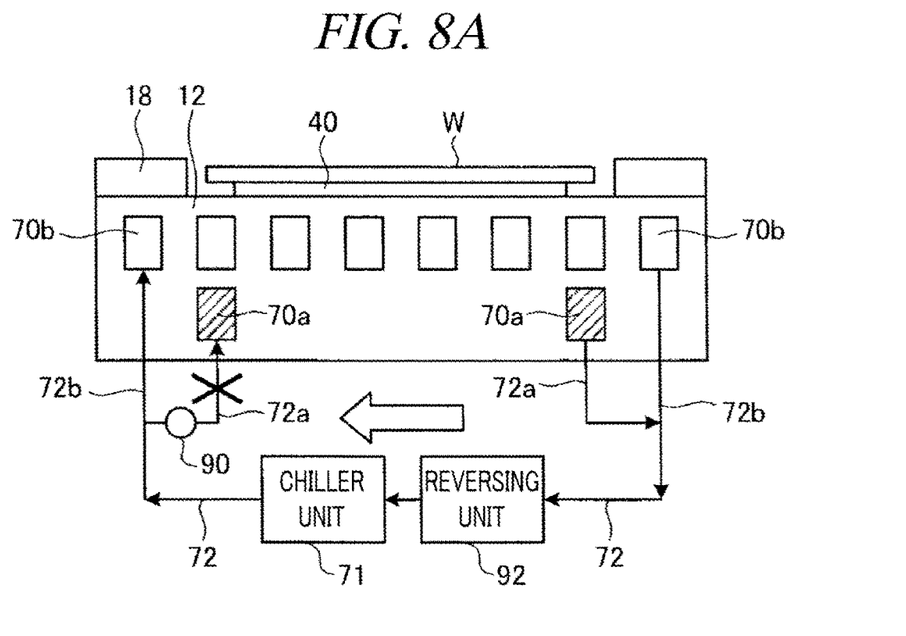
FIG. 8A is a diagram illustrating arrangement of coolant paths in accordance with a fourth example embodiment.
Figure 8B:
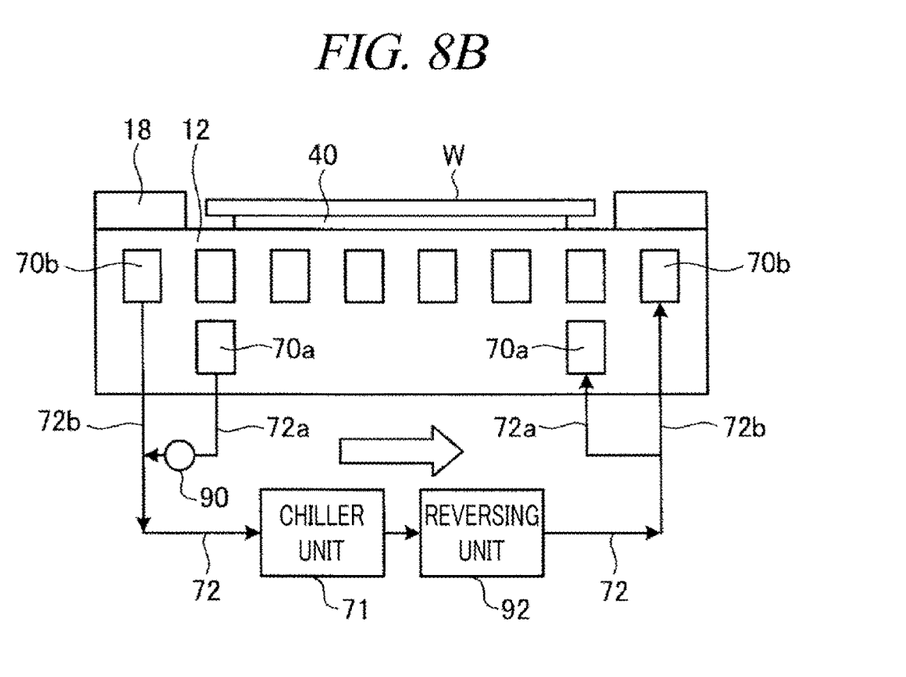
FIG. 8B is a diagram illustrating the arrangement of the coolant paths in accordance with the fourth example embodiment.

Subsequently, a fourth example embodiment regarding the arrangement of coolant paths will be described. FIG. 8A and FIG. 8B are diagrams illustrating the fourth example embodiment regarding the arrangement of coolant paths. As shown in FIG. 8A and FIG. 8B, in accordance with the fourth example embodiment, a second coolant path 70b is formed in a spiral shape in a region within the lower electrode 12 corresponding to the focus ring 18. Further, a first coolant path 70a is also formed in a spiral shape in a region within the lower electrode 12 below the second coolant path 70b and corresponding to a region where a periphery portion of the wafer W is placed.

The coolant cooled in the chiller unit 71 is flown out through the pipeline 72, and then, is flown into the first pipeline 72a and the second pipeline 72b which are branched from the pipeline 72. The first pipeline 72a is connected to one end of the first coolant path 70a, and the second pipeline 72b is connected to one end of the second coolant path 70b. Further, the coolant that has passed through the first coolant path 70a is flown out through the first pipeline 72a connected to the other end of the first coolant path 70a, and the coolant that has passed through the second coolant path 70b is flown out through the second pipeline 72b connected to the other end of the second coolant path 70b. The coolant flown out through the first pipeline 72a and the second pipeline 72b flows into the single pipeline 72 and is returned back into the chiller unit 71 via the reversing unit 92. Then, the coolant is cooled again in the chiller unit 71 and flows into and circulates through the inside of the lower electrode 12 again.

In accordance with the fourth example embodiment, when the temperature of the periphery portion of the wafer W becomes particularly high, by cooling the periphery portion of the wafer W selectively, a temperature uniformity of the wafer W can be maintained. That is, since the diameter of the wafer W is much larger than the diameter of the electrostatic chuck 40, the periphery portion of the wafer W is protruded from the electrostatic chuck 40. For the reason, when performing a plasma process in the state of FIG. 7A FIG. 8A, for example, the temperature of the periphery portion of the wafer W may become higher than the temperature of an inner portion thereof due to heat generated by the plasma process. In this case, the controller 80 is configured to reverse the flow direction of the coolant as shown in FIG. 8B by controlling the reversing unit 92, so that the coolant can flow in the region (i.e., the first coolant path 70a) within the lower electrode 12 corresponding to a region where the periphery portion of the wafer W is positioned. As a result, the periphery portion of the wafer W can be cooled by the coolant flowing through the first coolant path 70a, so that the temperature distribution of the wafer W can be uniformed.

Fifth Example Embodiment

Figure 9A:
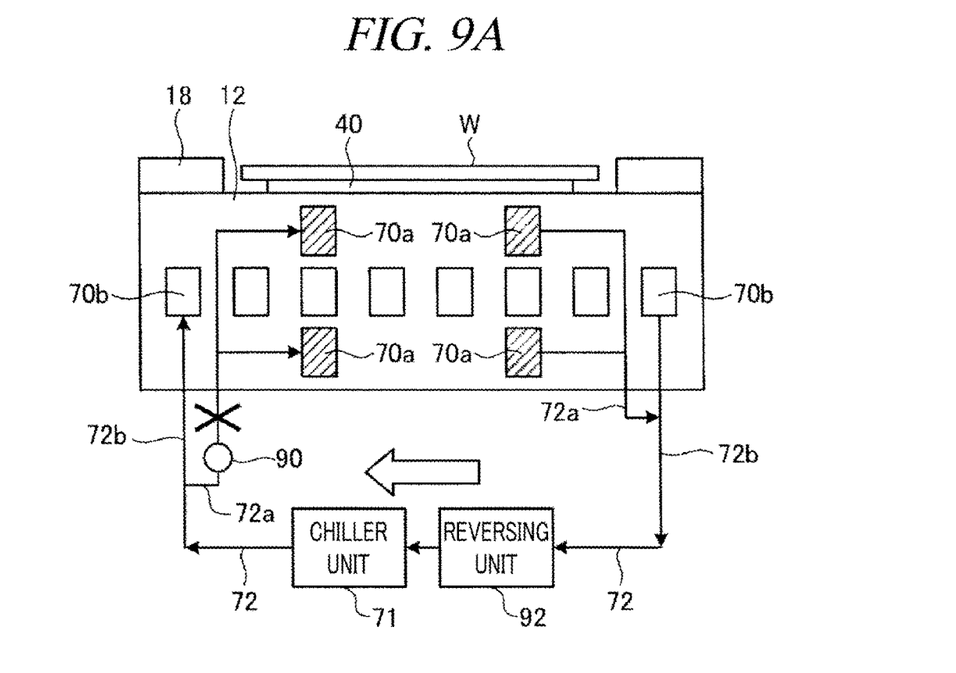
FIG. 9A is a diagram illustrating arrangement of coolant paths in accordance with a fifth example embodiment.
Figure 9B:
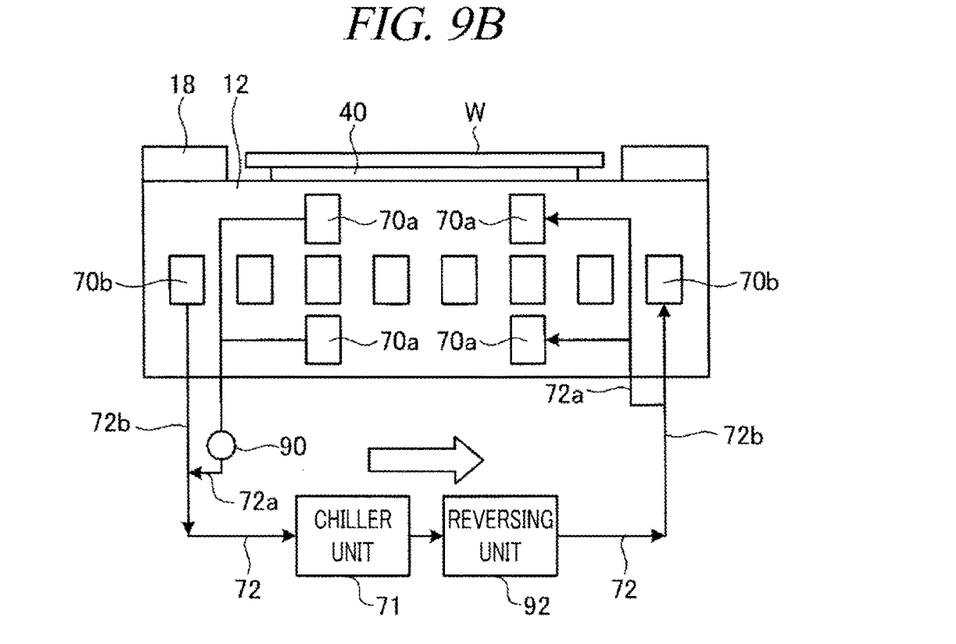
FIG. 9B is a diagram illustrating the arrangement of the coolant paths in accordance with the fifth example embodiment.

Then, a fifth example embodiment regarding the arrangement of coolant paths will be described. FIG. 9A and FIG. 9B are diagrams illustrating the fifth example embodiment regarding the arrangement of coolant paths. As shown in FIG. 9A and FIG. 9B, in accordance with the fifth example embodiment, a second coolant path 70b is formed in a spiral shape in a region within the lower electrode 12 corresponding to a region where the wafer W is placed. Further, first coolant paths 70a are also formed in spiral shapes in regions within the lower electrode 12 corresponding to an intermediate portion (middle region) between a central portion (center region) and a periphery portion (edge region) of the wafer W. The first coolant paths 70a are respectively formed above and below the second coolant path 70b.

The coolant cooled in the chiller unit 71 is flown out through the pipeline 72, and then, is flown into the first pipeline 72a and the second pipeline 72b which are branched from the pipeline 72. The first pipeline 72a is connected to one end of the first coolant path 70a, and the second pipeline 72b is connected to one end of the second coolant path 70b. Further, the coolant that has passed through the first coolant path 70a is flown out through the first pipeline 72a connected to the other end of the first coolant path 70a, and the coolant that has passed through the second coolant path 70b is flown out through the second pipeline 72b connected to the other end of the second coolant path 70b. The coolant flown out through the first pipeline 72a and the second pipeline 72b flows into the single pipeline 72 and is returned back into the chiller unit 71 via the reversing unit 92. Then, the coolant is cooled again in the chiller unit 71 and flows into and circulates through the inside of the lower electrode 12 again.

In accordance with the fifth example embodiment, when the temperature of the intermediate portion of the wafer W becomes particularly high, by cooling the intermediate portion of the wafer W selectively, the temperature uniformity of the wafer W can be maintained. That is, depending on the kind of a plasma process, the temperature of the intermediate portion (middle region) of the wafer W may become higher than those of the central portion (center region) and the periphery portion (edge region) of the wafer W. For example, when performing a plasma process in the state of FIG. 9A, the temperature of the intermediate portion of the wafer W may become higher than the temperatures of the central portion and the periphery portion thereof due to heat generated by the plasma process. In this case, the controller 80 is configured to reverse the flow direction of the coolant as shown in FIG. 9B by controlling the reversing unit 92, so that the coolant can flow in the region (i.e., the first coolant path 70a) with the lower electrode 12 corresponding to a region where the intermediate portion of the wafer W is positioned. As a result, the intermediate portion of the wafer W can be cooled by the coolant flowing through the first coolant path 70a, so that the temperature distribution of the wafer W can be uniformed.

As discussed above, in the plasma processing apparatus 1 and the temperature control method in accordance with the above example embodiments, by setting the simple configuration of providing the check valve 90 at the first pipeline 72a and reversing the flow direction of the coolant, the temperature of the wafer W can be controlled rapidly. Accordingly, when an optimum temperature condition for the wafer W is required in performing each plasma process, by reversing the flow direction of the coolant by the reversing unit 92 at the switchover timing of the plasma processes, an optimum plasma process can be performed. Further, from the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

I claim:

1. A plasma processing apparatus, comprising:
    a processing chamber in which a plasma processing space is formed;
    a mounting table provided within the processing chamber and configured to mount thereon a processing target substrate;
    a gas supply device configured to introduce a processing gas to be used in plasma reaction into the plasma processing space;
    a plasma generating device configured to supply electromagnetic energy to excite the processing gas introduced in the plasma processing space into plasma;
    a plurality of coolant paths formed within the mounting table;
    a temperature controller configured to control a temperature of a coolant flown and circulated through the plurality of coolant paths; and
    a reversing unit configured to reverse a flow direction of the coolant that flows and circulates through the plurality of coolant paths,
    wherein the plurality of coolant paths include a first coolant path and a second coolant path,
    a chiller unit pipeline is positioned between the temperature controller and the first and second coolant paths,
    an intermediate pipeline is positioned between the temperature controller and the reversing unit,
    a reversing unit pipeline is positioned between the reversing unit and the first and second coolant paths,
    the chiller unit pipeline is branched into two first pipelines and the two first pipelines are directly connected with the chiller unit pipeline,
    the reversing unit pipeline is branched into two second pipelines and the two second pipelines are directly connected with the reversing unit pipeline,
    one of the first pipelines and one of the second pipelines are connected with the first coolant path at different circumferential positions,
    the other one of the first pipelines and the other one of the second pipelines are connected with the second coolant path at different circumferential positions, a check valve is provided on or within the one of the first pipelines such that, when the coolant flows in one direction, the coolant flows only into the other one of the first pipelines from among the two first pipelines, the check valve includes a valve sheet and a plate-shaped valve body provided at the valve sheet, when the coolant flows in the one direction, the plate-shaped valve body of the check valve is configured to stand up by a force of the coolant, so that the one of the first pipelines is closed, and when the coolant flows in an opposite direction, the plate-shaped valve body of the check valve is configured to fall down by the force of the coolant, so that the one of the first pipelines is opened.

2. The plasma processing apparatus of claim 1, further comprising:

a controller configured to control the reversing unit to reverse the flow direction of the coolant according to a switchover timing of plasma processes performed in the plasma processing apparatus.

3. The plasma processing apparatus of claim 1, further comprising:

a focus ring provided on the mounting table to surround a region where the processing target substrate is placed, wherein the first coolant path is formed in a region within the mounting table corresponding to the focus ring and the second coolant path is formed in a region within the mounting table corresponding to the region where the processing target substrate is placed.

4. The plasma processing apparatus of claim 1, wherein the first coolant path and the second coolant path are formed in a region within the mounting table corresponding to a region where the processing target substrate is placed, and the first coolant path and the second coolant path are arranged separately in a vertical direction.

5. The plasma processing apparatus of claim 1, wherein the first coolant path is formed in a region within the mounting table corresponding to a region where the processing target substrate is placed, and the second coolant path is formed in a region within the mounting table corresponding to a region where a periphery portion of the processing target substrate is located.

6. The plasma processing apparatus of claim 1, wherein the first coolant path is formed in a region within the mounting table corresponding to a region where the processing target substrate is placed, and the second coolant path is formed in a region within the mounting table corresponding to a region where an intermediate portion between a central portion and a periphery portion of the processing target substrate thereof is located.

* * * * *

UNITED STATES PATENT AND TRADEMARK OFFICE
CERTIFICATE OF CORRECTION

PATENT NO. : 10,056,223 B2
APPLICATION NO. : 13/932151
DATED : August 21, 2018
INVENTOR(S) : Nobuyuki Nagayama Page 1 of 1

It is certified that error appears in the above-identified patent and that said Letters Patent is hereby corrected as shown below:

In the Specification

Column 11, Line 3, "in the state of FIG. 7A FIG. 8A," should be -- in the state of FIG. 8A, --.

Signed and Sealed this
Fourth Day of December, 2018

Andrei Iancu
*Director of the United States Patent and Trademark Office*